US012807509B2

(12) United States Patent
Nakamura et al.

(10) Patent No.: US 12,807,509 B2
(45) Date of Patent: Nov. 24, 2026

(54) PIEZOELECTRIC FILM CONTAINING A PEROVSKITE-TYPE OXIDE, MANUFACTURING METHOD FOR PIEZOELECTRIC FILM, AND PIEZOELECTRIC ELEMENT

(71) Applicant: FUJIFILM CORPORATION, Tokyo (JP)

(72) Inventors: Seigo Nakamura, Kanagawa (JP); Hiroyuki Kobayashi, Kanagawa (JP)

(73) Assignee: FUJIFILM CORPORATION, Tokyo (JP)

( * ) Notice: Subject to any disclaimer, the term of this patent is extended or adjusted under 35 U.S.C. 154(b) by 664 days.

(21) Appl. No.: 18/464,273

(22) Filed: Sep. 11, 2023

(65) Prior Publication Data

US 2023/0416108 A1 Dec. 28, 2023

Related U.S. Application Data

(63) Continuation of application No. PCT/JP2022/010718, filed on Mar. 10, 2022.

(30) Foreign Application Priority Data

Mar. 25, 2021 (JP) ................................ 2021-051660

(51) Int. Cl.
*C01G 33/00* (2006.01)
*C23C 14/08* (2006.01)
(Continued)

(52) U.S. Cl.
CPC .......... *C01G 33/006* (2013.01); *C23C 14/088* (2013.01); *C23C 14/345* (2013.01);
(Continued)

(58) Field of Classification Search
CPC ............... C01G 33/006; C01P 2002/34; C01P 2002/50; C01P 2002/72; C01P 2006/40;
(Continued)

(56) References Cited

U.S. PATENT DOCUMENTS

2008/0211880 A1* 9/2008 Hara ..................... B41J 2/1629 204/192.18
2008/0231667 A1 9/2008 Arakawa et al.
(Continued)

FOREIGN PATENT DOCUMENTS

JP 2008-266770 A 11/2008
JP 2008-306164 A 12/2008
(Continued)

OTHER PUBLICATIONS

Ge, Jun et al., "Enhanced polarization switching and energy storage properties of PbLa(ZrTi)O antiferroelectric thin films with LaNiO oxide top electrodes", Applied Physics Letters, vol. 102, No. 14, 2013 AIP Publishing LLC, Apr. 8, 2013, pp. 142905-142905, XP012171863.
(Continued)

*Primary Examiner* — Emily P Pham
(74) *Attorney, Agent, or Firm* — SOLARIS Intellectual Property Group, PLLC

(57) ABSTRACT

The piezoelectric film is a piezoelectric film containing a perovskite-type oxide as a main component, in which a current-voltage profile showing a relationship between a voltage and a current that flows in a case where the voltage is applied has two maximal values, where the current-voltage profile is acquired in a case where the voltage is sweep-applied from −40 V to +40 V at a first change rate of 10 kV/cm·sec while the piezoelectric film is sandwiched between a pair of electrode layers.

11 Claims, 6 Drawing Sheets

(51) Int. Cl.

| | |
|---|---|
| ***C23C 14/34*** | (2006.01) |
| ***H10N 30/076*** | (2023.01) |
| ***H10N 30/853*** | (2023.01) |

(52) U.S. Cl.
CPC ....... *H10N 30/076* (2023.02); *H10N 30/8554* (2023.02); *C01P 2002/34* (2013.01); *C01P 2002/50* (2013.01); *C01P 2002/72* (2013.01); *C01P 2006/40* (2013.01)

(58) Field of Classification Search
CPC .. C23C 14/088; C23C 14/345; H10N 30/076; H10N 30/704; H10N 30/8554; B41J 2/14
See application file for complete search history.

(56) References Cited

U.S. PATENT DOCUMENTS

| | | | | |
|---|---|---|---|---|
| 2008/0265718 | A1 | 10/2008 | Sakashita et al. | |
| 2008/0297005 | A1 | 12/2008 | Sakashita et al. | |
| 2008/0302658 | A1 | 12/2008 | Sasaki et al. | |
| 2010/0231095 | A1 * | 9/2010 | Kubota | H10N 30/078 29/25.35 |
| 2019/0019940 | A1 | 1/2019 | Hayashi et al. | |

FOREIGN PATENT DOCUMENTS

| | | | |
|---|---|---|---|
| JP | 2008-311634 | A | 12/2008 |
| JP | 2010-016011 | A | 1/2010 |
| JP | 2019-021701 | A | 2/2019 |

OTHER PUBLICATIONS

Boldyreva, Ksenia et al., "Microstructure and electrical properties of (120)O-oriented and of (001)O-oriented epitaxial antiferroelectric PbZrO3 thin films on (100) SrTiO3 substrates covered with different oxide bottom electrodes", Journal of Applied Physics, vol. 102, No. 4, 2007 American Institute of Physics, pp. 44111-44111, Aug. 23, 2007, XP012101556.
Xu, Baomin et al., "Antiferroelectric thin and thick films for high-strain microactuators", Integrated Ferroelectrics, vol. 22, No. 1-4, pp. 545-557, Mar. 1, 1998, XP093184724.
Extended European Search Report dated Aug. 9, 2024, issued in corresponding EP Patent Application No. 22775173.2.
International Search Report issued in International Application No. PCT/JP2022/010718 on Jun. 7, 2022.
Written Opinion of the ISA issued in International Application No. PCT/JP2022/010718 on Jun. 7, 2022.
English language translation of the following: Office action dated Aug. 19, 2025 from the JPO in a Japanese patent application No. 2023-509001 corresponding to the instant patent application.

* cited by examiner

COMPARATIVE EXAMPLE 2

EXAMPLE 1

EXAMPLE 4

EXAMPLE 5

COMPARATIVE EXAMPLE 3

EXAMPLE 9

PIEZOELECTRIC FILM CONTAINING A PEROVSKITE-TYPE OXIDE, MANUFACTURING METHOD FOR PIEZOELECTRIC FILM, AND PIEZOELECTRIC ELEMENT

CROSS-REFERENCE TO RELATED APPLICATIONS

This application is a continuation of International Application No. PCT/JP2022/010718, filed on Mar. 10, 2022, which claims priority from Japanese Patent Application No. 2021-051660, filed on Mar. 25, 2021. The entire disclosure of each of the above applications is incorporated herein by reference.

BACKGROUND

1. Technical Field

The present disclosure relates to a piezoelectric element, a piezoelectric film, and a manufacturing method for a piezoelectric film.

2. Related Art

As a material having excellent piezoelectricity and excellent ferroelectricity, there is known lead zirconate titanate ($Pb(Zr,Ti)O_3$, hereinafter referred to as PZT). The PZT is used in a ferroelectric random access memory (FeRAM) which is a non-volatile memory, by taking advantage of the ferroelectricity thereof. Furthermore, in recent years, a MEMS piezoelectric element including a PZT film has been put into practical use by fusing with micro electro-mechanical systems (MEMS) technology. A PZT film is applied as a piezoelectric film in a piezoelectric element having a lower electrode, a piezoelectric film, and an upper electrode on a substrate. This piezoelectric element has been developed into various devices such as a memory, an inkjet head (an actuator), a micromirror device, an angular velocity sensor, a gyro sensor, and an oscillation power generation device.

Current-electric field (I-E) measurement is known as one of the methods for the evaluation of electrical characteristics of a piezoelectric film. In the I-E measurement, the voltage applied between the pair of electrodes is changed in association with the elapse of the time in a state where the piezoelectric film is sandwiched between a pair of electrodes, and the current that flows between the electrodes when a voltage is applied is measured. The current measured in this case means that a charge is accumulated in the electrode, that is, the polarization of the piezoelectric film changes, and a polarization-electric field (PE) curve is obtained in a case of carrying out integration with respect to time.

JP2019-21701A discloses a ferroelectric substance in which a P-E curve exhibits two hystereses (double hysteresis) that are asymmetric with respect to an electric field of 0. The residual polarization Pr of the material exhibiting the double hysteresis polarization-electric field characteristics is 0 or a value close to 0, and thus in a case where the same potential is applied, a large displacement can be expected as compared with a material exhibiting the single hysteresis in which the residual polarization Pr is large.

JP2010-16011A discloses a piezoelectric element including a barium titanate-based piezoelectric film, where the piezoelectric element exhibits hysteresis in which in a P-E curve, the coercive electric fields in which the polarization P is 0 have the same reference numeral. The fact that hysteresis in which in a PE curve, the coercive electric fields at which the polarization P is 0 have the same reference numeral are provided means that a large electric field can be applied since the electric field in which the polarization inversion occurs is sufficiently large. This means that the dielectric breakdown voltage (hereinafter, referred to as the withstand voltage) is large and the pressure resistance is excellent. Since the applied voltage and the displacement amount are proportional to each other, a larger displacement amount can be obtained in a case where a larger voltage can be applied. Therefore, it is desirable that the withstand voltage of the piezoelectric film is high.

SUMMARY

The piezoelectric film disclosed in JP2019-21701A or JP2010-16011A has improved withstand voltage as compared with those in the related art; however, evaluation has not been carried out from the viewpoint of reliability indicating how long the piezoelectric film can be used. According to the study by inventors of the present invention, the reliability of the piezoelectric films in the related art disclosed in JP2019-21701A and JP2010-16011A is not sufficient. In a case where the piezoelectric film is applied to various devices, it is required that the withstand voltage is sufficiently high and the reliability is high.

The technology of the present disclosure has been made in consideration of the above circumstances, and an object of the present invention is to provide a piezoelectric film, a piezoelectric element, and a manufacturing method for a piezoelectric film, in which both high withstand voltage and long-term reliability are achieved.

Specific means for solving the above problems include the following aspects.

The piezoelectric film according to the present disclosure is a piezoelectric film containing a perovskite-type oxide as a main component, in which a current-voltage profile showing a relationship between a voltage and a current that flows in a case where the voltage is applied has two maximal values, where the current-voltage profile is acquired in a case where the voltage is sweep-applied from −40 V to +40 V at a first change rate of 10 kV/cm·sec while the piezoelectric film is sandwiched between a pair of electrode layers.

In the piezoelectric film according to the present disclosure, it is preferable that a current-voltage profile showing a relationship between a voltage and a current that flows in a case where the voltage is applied has only one maximal value, where the current-voltage profile is acquired in a case where the voltage is sweep-applied from −40 V to +40 V at a second change rate of 50 kV/cm·see while the piezoelectric film is sandwiched between the pair of electrode layers.

In the piezoelectric film according to the present disclosure, it is preferable that in a case where, among the two maximal values in the current-voltage profile acquired at the first change rate, a maximal value on a low voltage side is denoted as P1, and a maximal value on a high voltage side is denoted as P2, $0.3 \leq P2/P1$ is satisfied.

In the piezoelectric film according to the present disclosure, it is preferable that in a case where, among the two maximal values in the current-voltage profile acquired at the first change rate, a maximal value on a low voltage side is denoted as P1, and a maximal value on a high voltage side is denoted as P2, $P2/P1 \leq 1$ is satisfied.

In the piezoelectric film according to the present disclosure, it is preferable that the perovskite-type oxide contains Pb, Zr, Ti, and O.

In the piezoelectric film according to the present disclosure, it is preferable that the perovskite-type oxide is a compound represented by General Formula (1), $$Pb\{(Zr_xTi_{1-x})_{1-y}M_y\}O_3 \quad (1)$$

$0<x<1,\ 0<y<0.3$ here, M is one or more elements selected from V, Nb, Ta, Sb, Mo, and W.

It is preferable that the piezoelectric film according to the present disclosure is preferably a (100) plane-aligned alignment film.

In the piezoelectric film according to the present disclosure, it is preferable that a magnitude of a piezoelectric constant $d_{31}$ is 200 pm/V or more, and a withstand voltage is 50 V/μm or more.

The piezoelectric element according to the present disclosure is A piezoelectric element that is obtained by laminating, on one surface of a substrate, a lower electrode, a piezoelectric film, and an upper electrode in this order, where the piezoelectric film is the piezoelectric film according to the present disclosure.

In the manufacturing method for a piezoelectric film according to the present disclosure, in a case of forming a film of the piezoelectric film on a film-forming substrate by a sputtering method, the film formation is carried out in an initial stage of the film formation in a state where the film-forming substrate is grounded or in a state where a positive bias voltage is applied to the film-forming substrate, and then the film formation is carried out in a state where a negative bias voltage is applied to the film-forming substrate.

In the manufacturing method for a piezoelectric film according to the present disclosure, it is preferable that the negative bias voltage is −20 V to −100 V.

According to the present disclosure, it is possible to obtain a piezoelectric film, a piezoelectric element, and a manufacturing method for a piezoelectric film, in which both high withstand voltage and long-term reliability are achieved.

DESCRIPTION OF EMBODIMENTS

Figure 1:
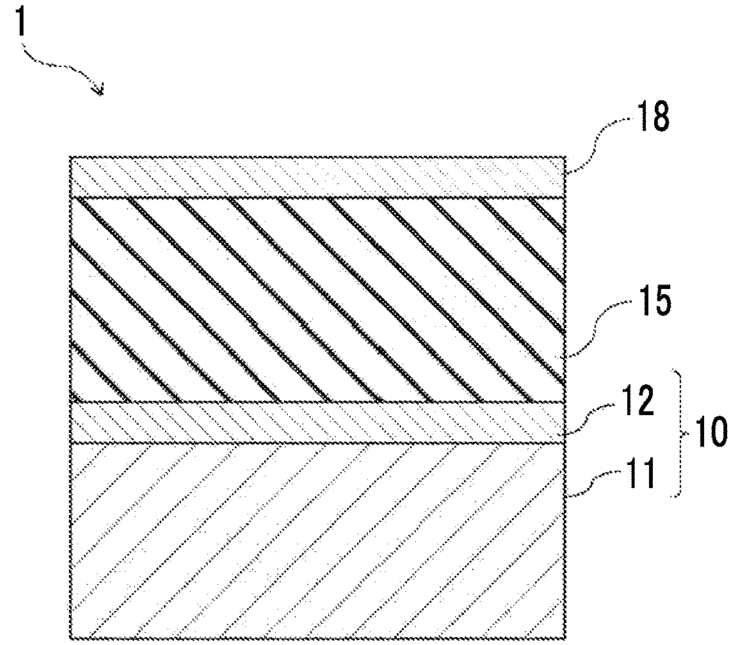
FIG. 1 is a cross-sectional view showing a layer configuration of a piezoelectric element according to one embodiment.

Hereinafter, embodiments according to the present invention will be described with reference to the drawings. In the drawings below, the layer thickness of each of the layers and the ratio therebetween are appropriately changed and drawn for easy visibility, and thus they do not necessarily reflect the actual layer thickness and ratio.

FIG. 1 is a schematic cross-sectional view showing a layer configuration of a piezoelectric element 1 according to one embodiment. As shown in FIG. 1, a piezoelectric element 1 includes, on a substrate 11, a lower electrode layer 12, a piezoelectric film 15, and an upper electrode layer 18 in this order.

The piezoelectric film 15 contains, as a main component, a perovskite-type oxide represented by the general formula $ABO_3$. In the piezoelectric film 15 between the lower electrode layer 12 and the upper electrode layer 18, a profile showing a relationship between a voltage and a current (hereinafter, also referred to as a first profile) has two maximal values P1 and P2, where the profile is acquired in a case where the voltage is sweep-applied from −40 V to +40 V at a first change rate of 10 kV/cm·sec (see FIG. 2). In addition, In the piezoelectric film 15 between the lower electrode layer 12 and the upper electrode layer 18, it is preferable that a profile showing a relationship between a voltage and a current (hereinafter, also referred to as a first profile) has only one maximal value P, where the profile is acquired in a case where the voltage is sweep-applied from −40 V to +40 V at a second change rate of 50 kV/cm·sec (see FIG. 2).

Figure 2:
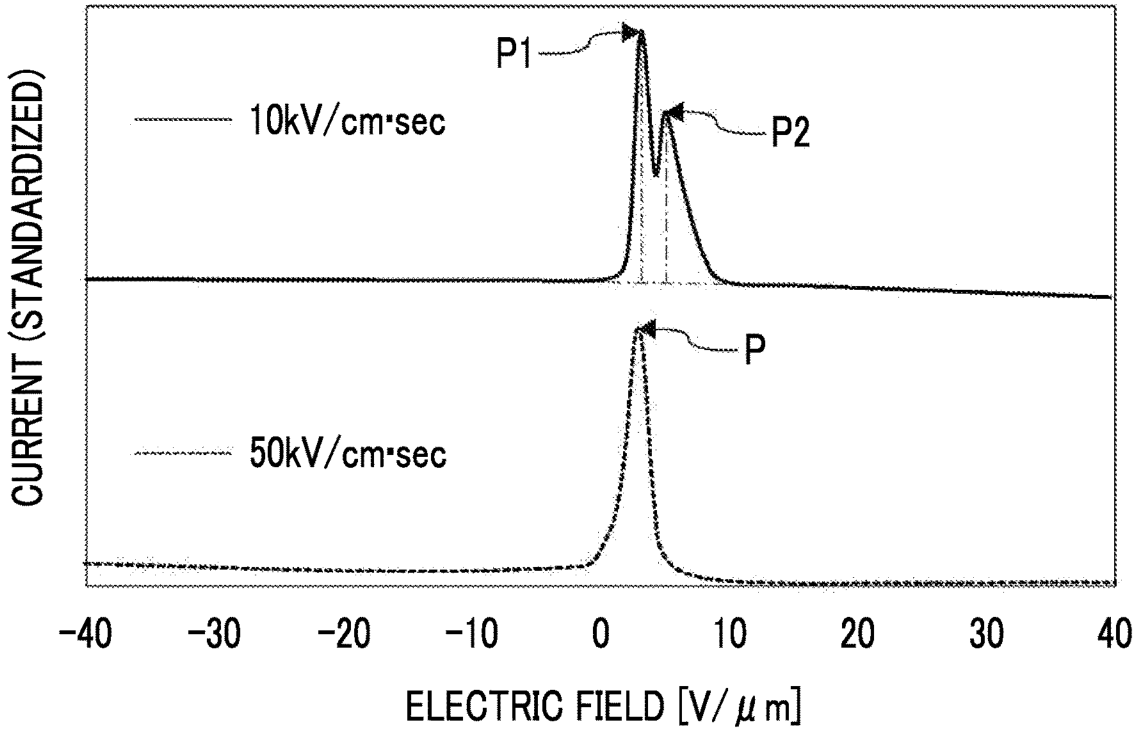
FIG. 2 is a schematic view of an I-E profile for a piezoelectric film according to the present disclosure.

FIG. 2 schematically shows an example of a current-electric field profile (I-E profile) showing a relationship between an applied voltage and a current regarding the piezoelectric film 15 according to the present disclosure. It is noted that although the lateral axis indicates the electric field obtained by dI-Viding the voltage by the film thickness, the behavior of the current-electric field profile is the same as that of the current-voltage (I-V) profile. That is, in a case where two peaks are present in the I-E profile, two peaks are also present in the I-V profile, and in a case where there is only one peak in the I-E profile, there is also only one peak in the I-V profile. In FIG. 2, the solid line indicates a first profile that is acquired in a case where the applied voltage is changed at a first change rate of 10 kV/cm·sec, and the dotted line indicates a second profile that is acquired in a case where the applied voltage is changed at a second change rate of 50 kV/cm-sec. As shown in FIG. 2, the maximal value P in the second profile is generated at substantially the same voltage as the maximal value P1 which is one on a lower voltage side among the two maximal values P1 and P2 in the first profile.

The inventors of the present inventions found that even in a piezoelectric film containing a perovskite oxide as a main component, in which no difference has been found in the crystal structure evaluation by X-ray diffraction (XRD) and the composition evaluation by X-ray fluorescence analysis (XRF), there is a case where two maximal values are present, and there is a case where only one maximal value is present in the first profile which is acquired in a case where a voltage is sweep-applied from −40 V to +40 V at the first change rate (see Examples below). In addition, it was found that in a case where the first profile has two maximal values for a piezoelectric film containing a perovskite-type oxide as a main component, it is possible to achieve both high pressure resistance and high reliability as compared with a piezoelectric film having only one maximal value (see Examples below). It is noted that the voltage sweep rate of 10 kV/cm-sec corresponds to a frequency much smaller than the frequency that is generally used in a case where the I-V measurement is carried out. Therefore, it is not general to carry out the I-V measurement at such a voltage sweep rate.

Although the mechanism by which the piezoelectric film 15 having two maximal values in the first profile can achieve both high withstand voltage and high reliability as described above is not revealed, the inventors of the present inventions presume as follows.

In a case where the I-E profile is converted into a P-E profile, the maximal value of the I-E profile appears as an inflection point in the P-E profile. It is known that the number of inflection points in the P-E profile corresponds to the number of phase transitions (see JP2010-16011A). That is, it is conceived that the reason why the first profile has two maximal values P1 and P2 is that the two times of phase transition in the piezoelectric film due to the voltage sweep.

The following two aspects are conceivable as the aspect in which the two times of phase transition in the piezoelectric film. A first aspect in which one phase undergoes phase transition twice in the piezoelectric film, and a first aspect in which the piezoelectric film has two phases having response voltages different from each other and two phases having response voltages different from each other undergo a sequential phase transition.

Figure 5:
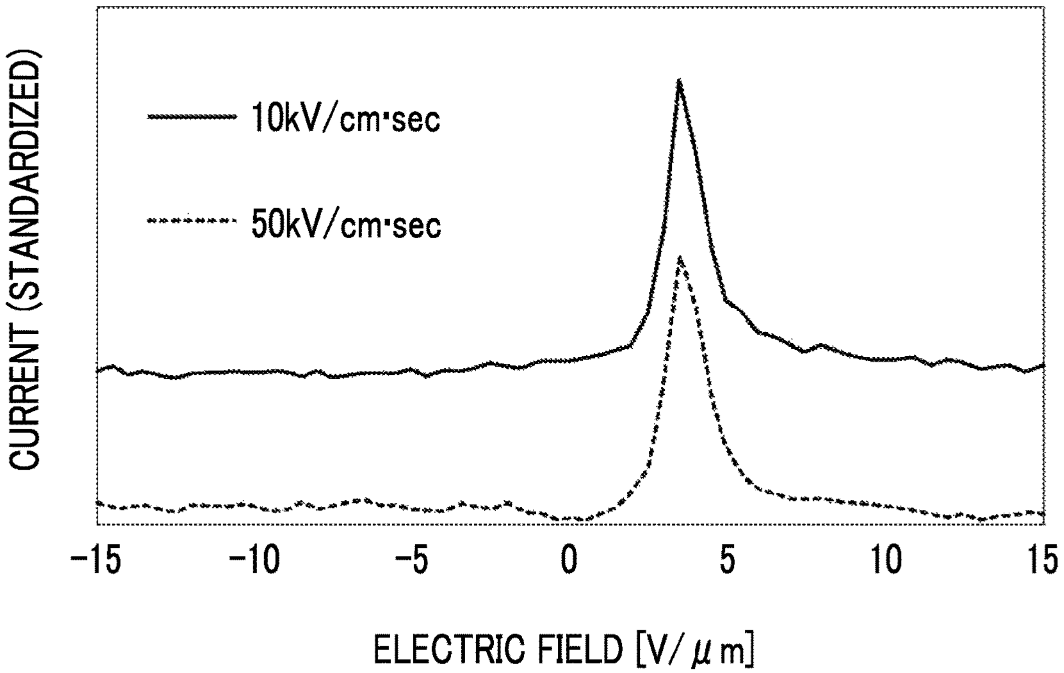
FIG. 5 is a view showing an I-E profile of Comparative Example 2.
Figure 6:
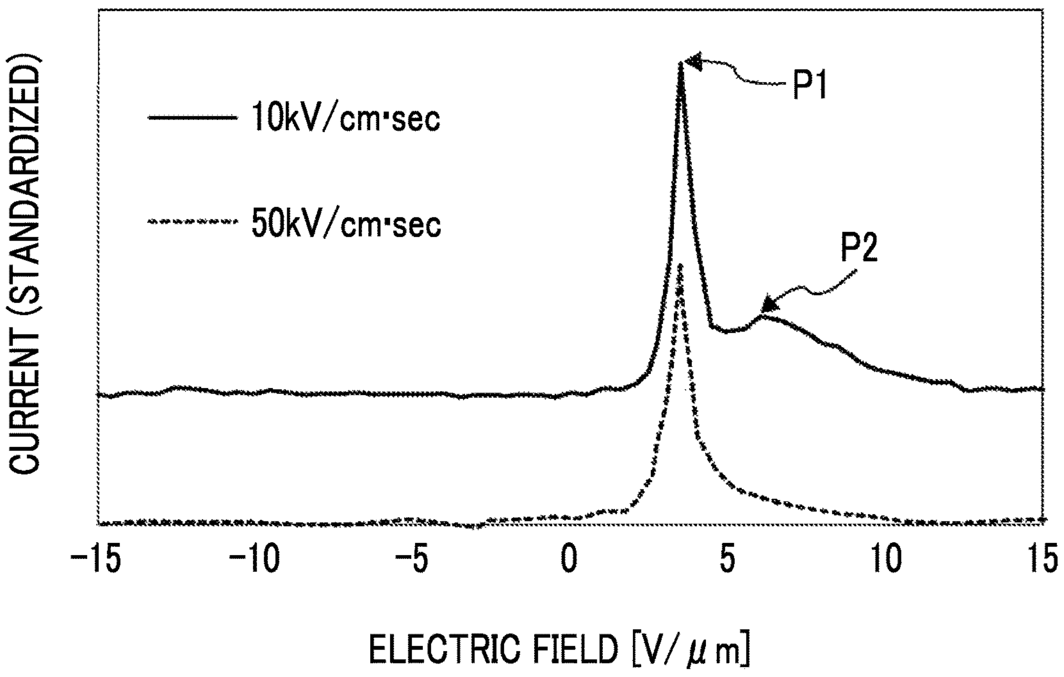
FIG. 6 is a view showing an I-E profile of Example 1.
Figure 7:
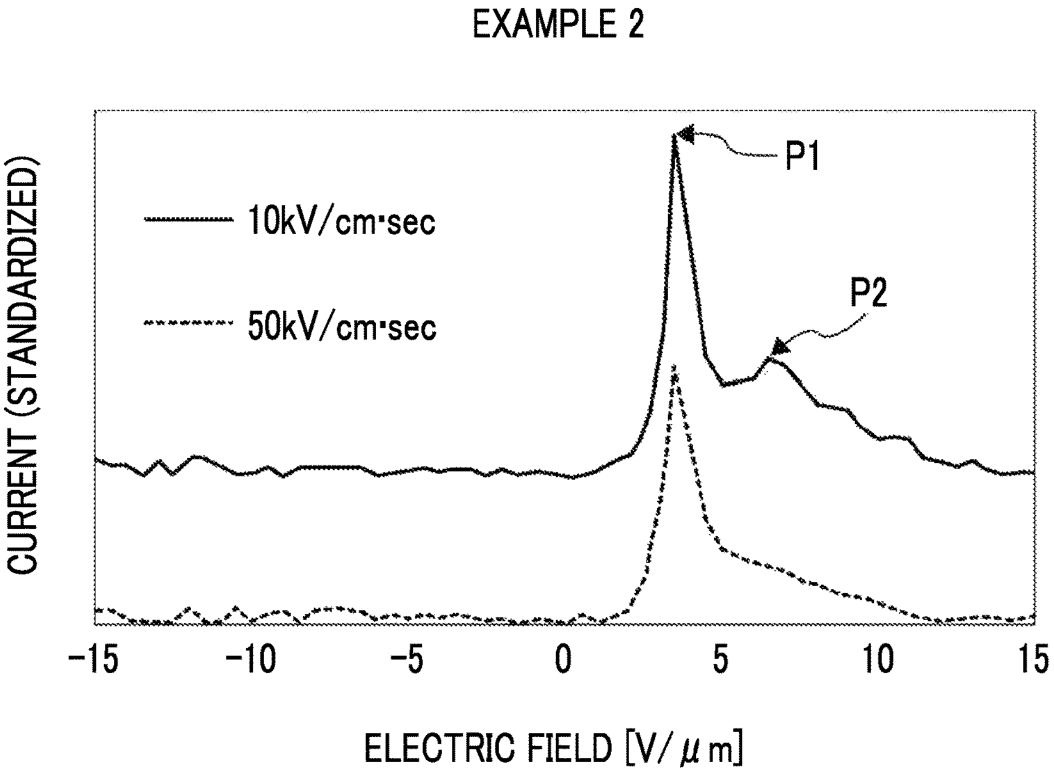
FIG. 7 is a view showing an I-E profile of Example 2.
Figure 8:
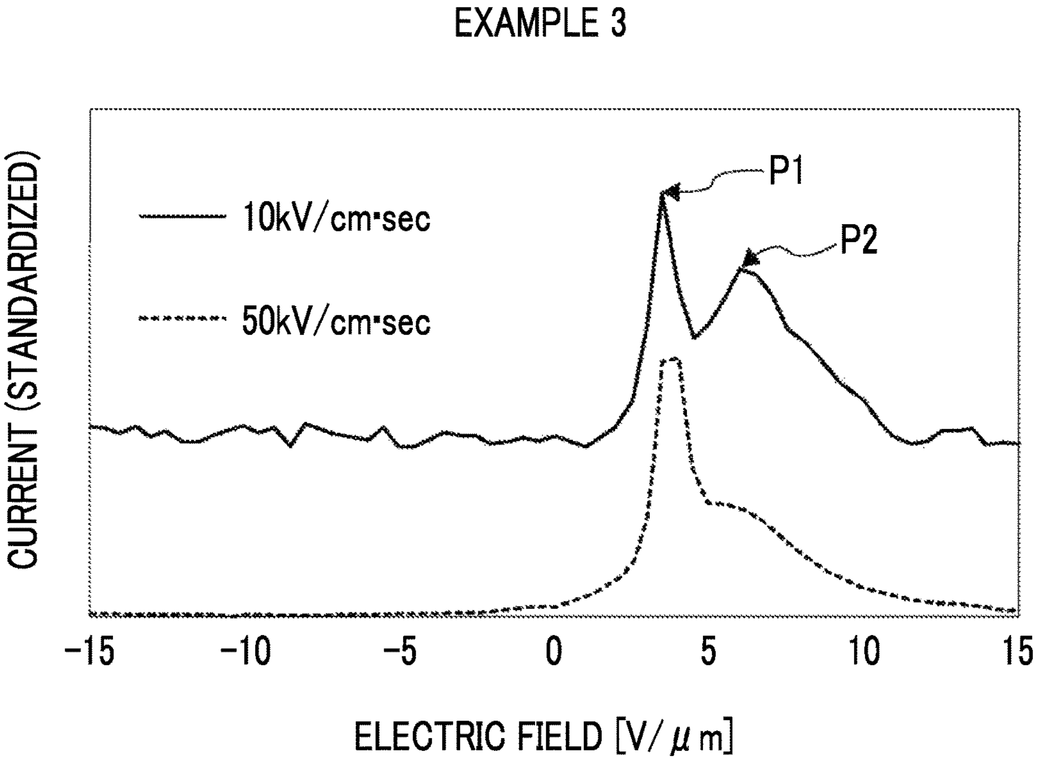
FIG. 8 is a view showing an I-E profile of Example 3.
Figure 9:
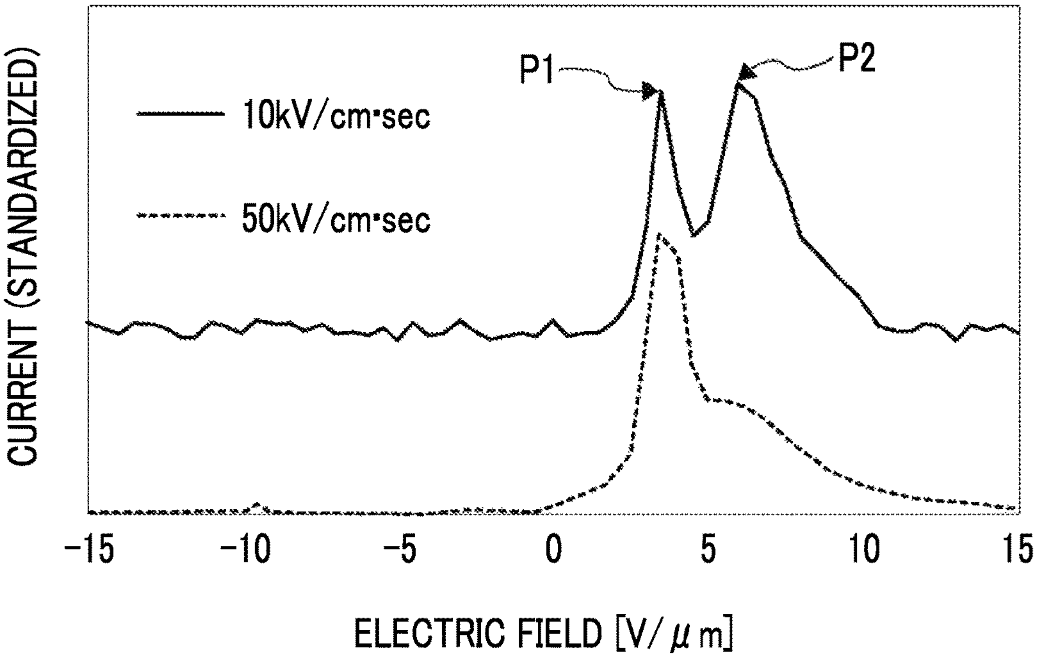
FIG. 9 is a view showing an I-E profile of Example 4.
Figure 10:
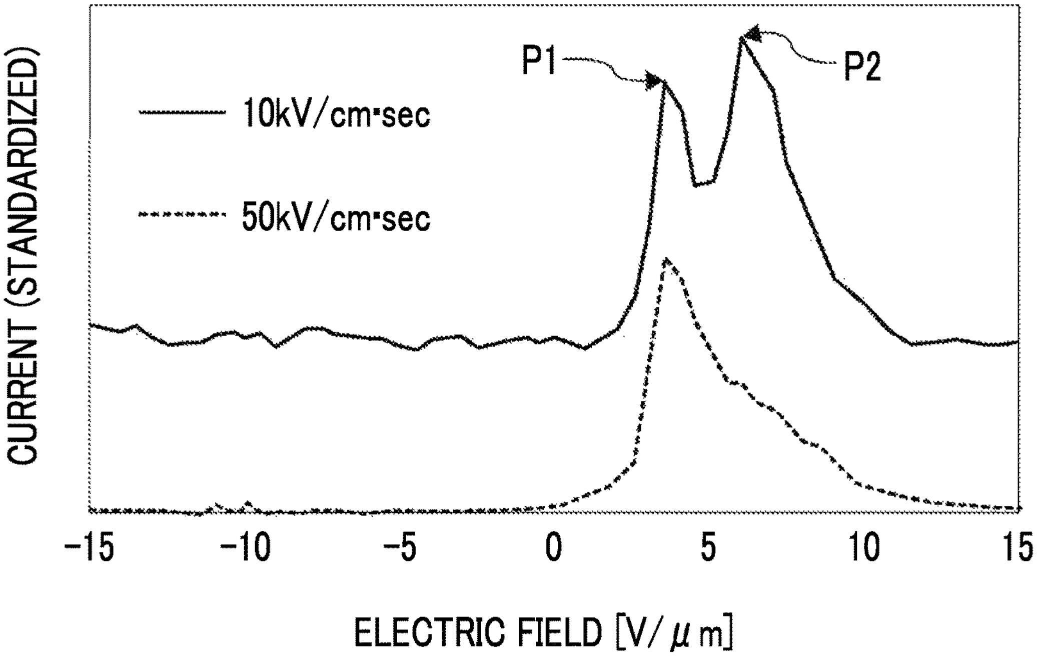
FIG. 10 is a view showing an I-E profile of Example 5.
Figure 11:
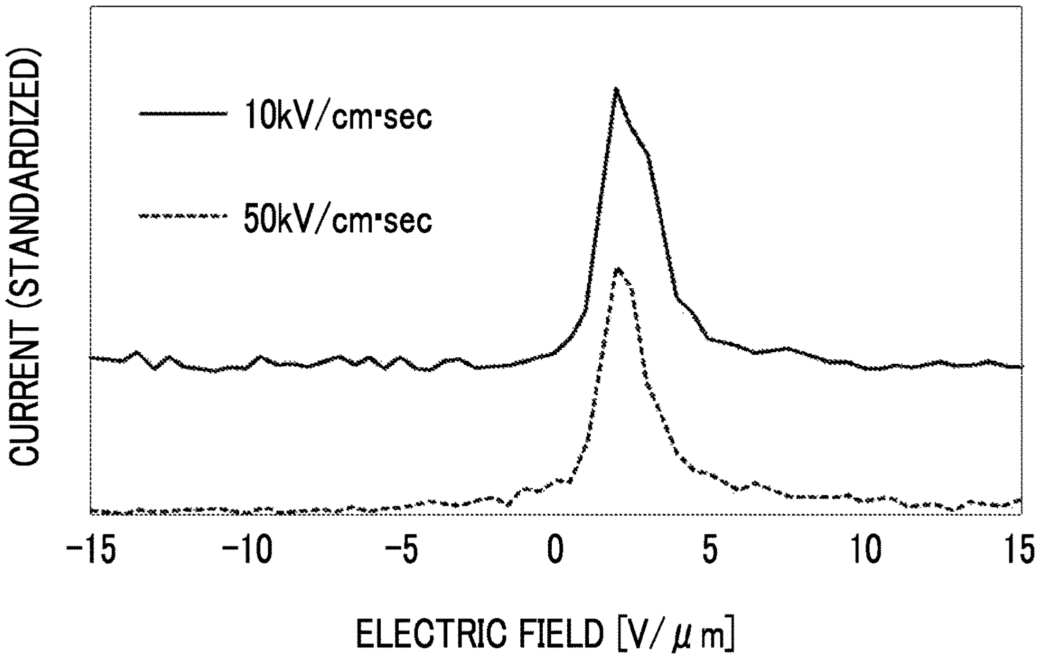
FIG. 11 is a view showing an I-E profile of Comparative Example 3.
Figure 12:
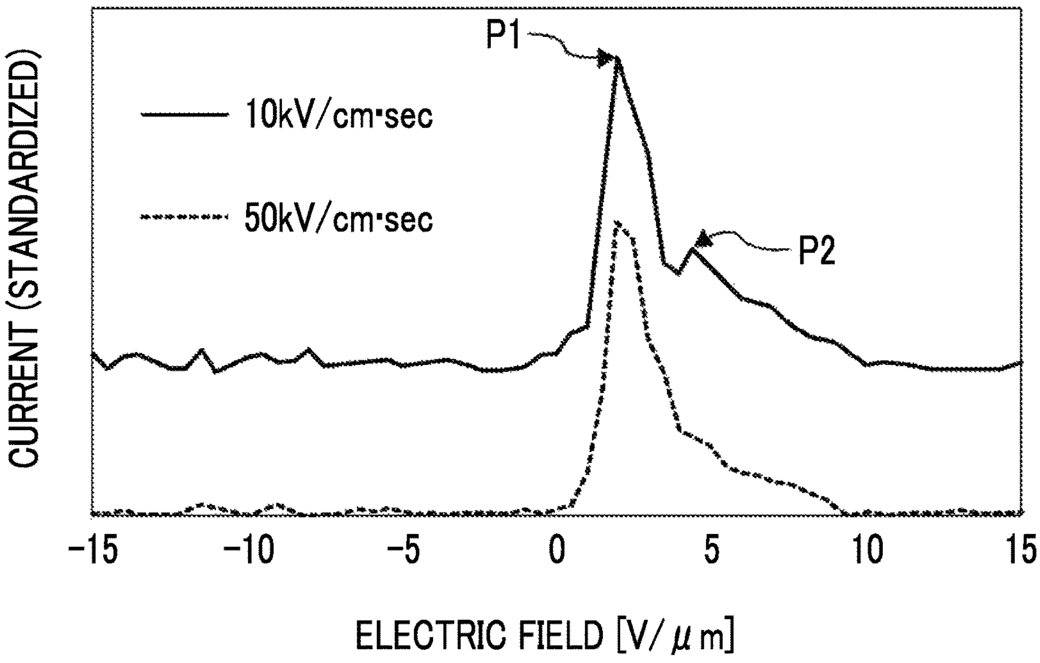
FIG. 12 is a view showing an I-E profile of Example 9.

In the piezoelectric film in the related art, the first profile has only one maximal value (see the solid line in FIG. 5), and the voltage at which the maximal value is generated is comparable to the voltage at which the maximal value P1 is generated, where the maximal value P1 is on a lower voltage side among the two maximal values P1 and P2 in the first profile of the present piezoelectric film 15 (see the solid line in FIG. 6). That is, it is conceived that, among the two maximal values P1 and P2 of the first profile, the maximal value P1 generated on the side where the voltage is low exhibits a phase transition due to a phase equivalent to the phase included in the piezoelectric film in the related art. On the other hand, it is conceived that the maximal value P2 generated on the side where the voltage is high is generated by a phase different from the phase included in the piezoelectric film in the related art. Although it is not revealed whether the two times of phase transition occur in any of the first aspect and the second aspect described above, It is presumed that the present piezoelectric film 15 obtains high withstand voltage and high reliability by including the phase that causes the maximal value P2. Then, inventors of the present inventions consider that the phase in which the maximal value P2 is generated is more stable than the phase in which the maximal value P1 is generated, and thus high withstand voltage and high reliability are obtained.

It is noted that as shown in FIG. 2, it is preferable that the piezoelectric film 15 has only one maximal value in the second profile in addition to having two maximal values P1 and P2 in the first profile. In this case, the maximal value of the second profile is generated at substantially the same voltage as the maximal value P1 on the lower voltage side in the first profile.

In a case where the piezoelectric film 15 has two maximal values P1 and P2 in the first profile and has only one maximal value generated at substantially the same voltage as the maximal value P1 in the second profile, as shown in FIG. 2, it is conceived that the component contributing to the generation of the maximal value P2 is a phase that cannot respond to the first change rate and does not undergo a phase transition at the first change rate. That is, it is conceived that among the two maximal values P1 and P2 indicated in the first profile, the maximal value P1 generated at a relatively low voltage is associated with a phase transition due to a phase having a relatively fast response speed (small time constant), and the maximal value P2 generated at a relatively high voltage is associated with a phase transition due to a phase having a relatively slow response speed (large time constant).

In general, in a perovskite-type oxide, that the longer time is taken for a polarization change to occur in a phase transition due to an applied voltage (the slower response speed) means that a more stable crystal structure is obtained. That is, it is presumed that in a case where the piezoelectric film 15 according to the present disclosure has only one maximal value in the second profile in addition to having two maximal values P1 and P2 in the first profile, it realizes high withstand voltage and high reliability by including a component having a relatively slow response speed, that is, a stable component, in addition to a component having a relatively high response speed.

In a case of assuming that one phase has undergone two times of phase transition in the first profile, that is, a first phase transition from a first phase to a second phase and a second phase transition from the second phase to a third phase occur, the second phase transition does not occur in the second profile. This means that the second phase is a stable phase. In addition, It can be presumed that high withstand voltage and high reliability can be realized since the piezoelectric film 15 includes the stable second phase that does not undergo a phase transition in a case of measurement at the second change rate.

On the other hand, in a case of assuming that the piezoelectric film 15 includes two phases having response voltages different from each other, the maximal value P2 on the higher voltage side among the two maximal values of the first profile is stable, and thus the response speed is slow, and it can be also conceived to be a phase that does not respond at the second change rate.

It is preferable that in a case where, among the two maximal values in the current-voltage profile measured at the first change rate, a maximal value on a low voltage side is denoted as P1, and a maximal value on a high voltage side is denoted as P2, $0.3 \leq P2/P1$ is satisfied.

It is conceived that the peak of the maximal value B is generated due to the stable component in the piezoelectric film 15, and in a case where the proportion of the current peak ratio of the stable component is 30% or more of the other components, the reliability can be enhanced.

In addition, it is preferable to satisfy $P2/P1 \leq 1$.

In a case of being applied to a device, it is conceived that the component that causes distortion in the piezoelectric film and causes displacement in the element is mainly the component that contributes to the maximal value P1 (the component having a relatively fast response speed) as described above. In a case of satisfying $P2/P1 \leq 1$, the component that mainly contributes to the displacement can occupy equal to more than half in terms of the current peak ratio, and thus higher piezoelectricity can be realized.

The piezoelectric film 15 according to the present disclosure contains a perovskite-type oxide as a main component. Here, "containing a perovskite-type oxide as a main component" means that the perovskite-type oxide occupies 80% by mole or more of the piezoelectric film. It is preferable that the piezoelectric film 15 consists of a perovskite-type oxide (however, it contains unavoidable impurities).

The perovskite-type oxide is preferably a lead zirconate titanate (PZT) that contains lead (Pb), zirconium (Zr), titanium (Ti), and oxygen (O).

In particular, it is preferable that the perovskite-type oxide is a compound represented by General Formula (1), which contains an additive M in the B site of PZT.

$$Pb\{(Zr_xTi_{1-x})_{1-y}M_y\}O_3 \quad (1)$$

Here, M is preferably one or more elements selected from vanadium (V), niobium (Nb), tantalum (Ta), antimony (Sb), molybdenum (Mo), and tungsten (W). Here, $0<x<1$ and $0<y<0.3$ are satisfied. It is noted that regarding $Pb:\{(Zr_xTi_{1-x})_{1-y}M_y\}:O$ in General Formula (1), a reference ratio thereof is 1:1:3; however, it suffices that the ratio is in a range in which a perovskite structure is obtained.

M may be a single element such as V only or Nb only, or it may be a combination of two or three or more elements, such as a mixture of V and Nb or a mixture of V, Nb, and Ta. In a case where M is these elements, a very high piezoelectric constant can be realized in combination with Pb of the A site element.

It is preferable that the piezoelectric film 15 is preferably a (100) plane-aligned alignment film. Here, "the piezoelectric film 15 is a (100) plane-aligned alignment film" means that the piezoelectric film 15 is a film in which the (100) plane is preferentially aligned substantially parallel to the film surface in a state where no voltage is applied and no voltage is applied. Here, the "preferentially aligned" means that the alignment is such that the alignment degree of the (100) plane is 60% or more. The alignment degree shall be calculated from an XRD chart acquired by X-ray diffraction (XRD) measurement. Alignment degree=Σ(100) peak/Σ((100) peak+(110) peak+(111) peak)). In the (100) plane-aligned piezoelectric film 15, a high piezoelectric constant $d_{31}$ can be obtained.

It is preferable that a magnitude of a piezoelectric constant $d_{31}$ is 200 pm/V or more, and a withstand voltage is 50 V/μm or more. A measuring method for the piezoelectric constant and the withstand voltage will be described in the section of Examples described later.

The thickness of the piezoelectric film 15 is generally 200 nm or more, and it is, for example, 0.2 μm to 5 μm. However, it is preferably 1 μm or more.

The piezoelectric element 1 is configured such that an electric field is applied to the piezoelectric film 15 in the film thickness direction, by the lower electrode layer 12 and the upper electrode layer 18. Each layer of the piezoelectric element 1 other than the piezoelectric film 1 will be described.

The substrate 11 is not particularly limited, and examples thereof include substrates such as silicon, glass, stainless steel, yttrium-stabilized zirconia, alumina, sapphire, and silicon carbide. As the substrate 11, a laminated substrate such as silicon-on-insulator (SOI) substrate having a $SiO_2$ oxide film formed on the surface of the silicon substrate, may be used.

The lower electrode layer 12 is an electrode for applying a voltage to the piezoelectric film 15. The main component of the lower electrode layer 12 is not particularly limited, and examples thereof include metals such as gold (Au), platinum (Pt), iridium (Ir), ruthenium (Ru), Ti, Mo, Ta, aluminum (Al), copper (Cu), and silver (Ag), and metal oxides thereof, as well as combinations thereof. In addition, indium tin oxide (ITO), $LaNiO_3$, $SrRuO_3$ (SRO), or the like may be used. Various intimate attachment layers or seed layers may be included between the piezoelectric film 15 and the lower electrode layer 12 and between the lower electrode layer 12 and the substrate 11.

The upper electrode layer 18 is paired with the lower electrode layer 12 and is an electrode for applying a voltage to the piezoelectric film 15. The main component of the upper electrode layer 18 is not particularly limited, and examples thereof include, in addition to the materials exemplified in the lower electrode layer 12, electrode materials that are generally used in a semiconductor process such as chromium (Cr) and a combination thereof. However, it is preferable to use an oxide conductor in a region in contact with the piezoelectric film 15. Specific examples thereof include $LaNiO_3$ and ZnO which has undergone doping, in addition to ITO, an iridium oxide, and SRO. In a case of providing an oxide conductor in a region of the upper electrode layer 18, the region being in contact with the piezoelectric film 15, oxygen elements are less likely to come out from the piezoelectric film 15 as compared with a case where a metal is in direct contact with the piezoelectric film 15, and thus an effect of suppressing decreases in piezoelectricity can be obtained.

Here, "lower" and "upper" do not respectively mean top and bottom in the vertical direction. As a result, an electrode disposed on the side of the substrate with the piezoelectric film being interposed is merely referred to as the lower electrode, and an electrode disposed on the side of the piezoelectric film opposite to the base material is merely referred to as the upper electrode.

The layer thicknesses of the lower electrode layer 12 and the upper electrode layer 18 are not particularly limited, and they are preferably about 50 nm to 300 nm and more preferably 100 nm to 300 nm.

A manufacturing method for the piezoelectric film 15 will be described.

A lower electrode layer 12 is formed on the substrate 11, and this is used as the film-forming substrate 10. The piezoelectric film 15 is formed by forming a film on the film-forming substrate 10 by a sputtering method.

In the initial stage of the formation of a film of the piezoelectric film 15, the film formation is carried out in a state where the film-forming substrate 10 is grounded or in a state where a positive bias voltage is applied to the film-forming substrate 10. Then, the bias voltage is switched to a negative bias voltage, and the film formation is carried out until a desired film thickness is obtained.

The positive bias voltage applied during the initial film formation is preferably 0 V (ground) to 60 V and more preferably 20 V to 40 V. In addition, the negative bias voltage that is switched during the film formation is preferably −20 V to −100 V and more preferably −40 V to −80 V.

The timing at which the bias voltage applied to the film-forming substrate 10 is grounded or switched from the positive bias voltage to the negative bias voltage may be any timing after the initial nuclei generation of the perovskite structure of the piezoelectric film 15 has been completed; however, it is preferably after a film of tens of nm has been formed. On the other hand, in order to obtain a film thickness for the film formation by applying high plasma energy as a negative bias voltage to the film-forming substrate 10, the film thickness for film formation with a grounding or a positive bias voltage is preferably several hundred nm or less. The switching timing is a timing at which the film thickness of the film formed with grounding or a positive bias voltage is 30 nm to 300 nm.

As described above, according to the manufacturing method for a piezoelectric film according to the present embodiment, in a case where the piezoelectric film 15 is formed into a film by a sputtering method, the film-forming substrate 10 is grounded or a positive bias voltage is applied to the film-forming substrate 10 during the initial film formation, and then the bias voltage applied to the film-forming substrate 10 is switched to a negative value to carry out the film formation in a state where a negative bias voltage is applied to the film-forming substrate 10. Such a film forming method makes it possible to obtain the piezoelectric film according to the above-described embodiment, which shows two maximal values in the first profile.

In a case where a perovskite oxide film is formed into a film by a sputtering method, it is known that the piezoelectric performance deteriorates in the piezoelectric film formed in a state where a negative bias voltage is applied to a film-forming substrate as compared with a piezoelectric film formed in a state where a positive bias voltage is applied. It is conceived that this is caused by so-called plasma damage, in which defects are generated by collision of plasma ions with the film-forming surface. In order to suppress the generation of crystal defects due to plasma damage, in the related art, the film formation of the piezoelectric film has been carried out in a state where a positive bias voltage is applied. In addition, the bias voltage has not been changed during the film formation of the piezoelectric film. During the initial film formation, that is, during the formation of crystal nuclei of the perovskite-type oxide, the manufacturing method for a piezoelectric film according to the present embodiment adopts conditions with less plasma damage, in which the film-forming substrate 10 is grounded or a positive bias voltage is applied to the film-forming substrate 10, and thus it is possible to form a crystal nuclei having high crystallinity. Then, after the crystal nuclei having high crystallinity are formed, the bias voltage applied to the film-forming substrate 10 is switched to a negative value, and the piezoelectric film is formed into a film until the desired thickness is obtained.

Since the crystal nuclei having high crystallinity are formed during the initial film formation, it is possible to obtain a perovskite structure having high crystallinity even in a case where the film formation is carried out under the conditions which may subsequently cause plasma damage, in which a negative bias voltage is applied to the film-forming substrate 10. In addition, it is conceived that in a case of forming a film of the piezoelectric film in a state where a negative bias voltage is applied to the film-forming substrate 10, it is possible to form a stable phase in the film.

EXAMPLES

Figure 3:
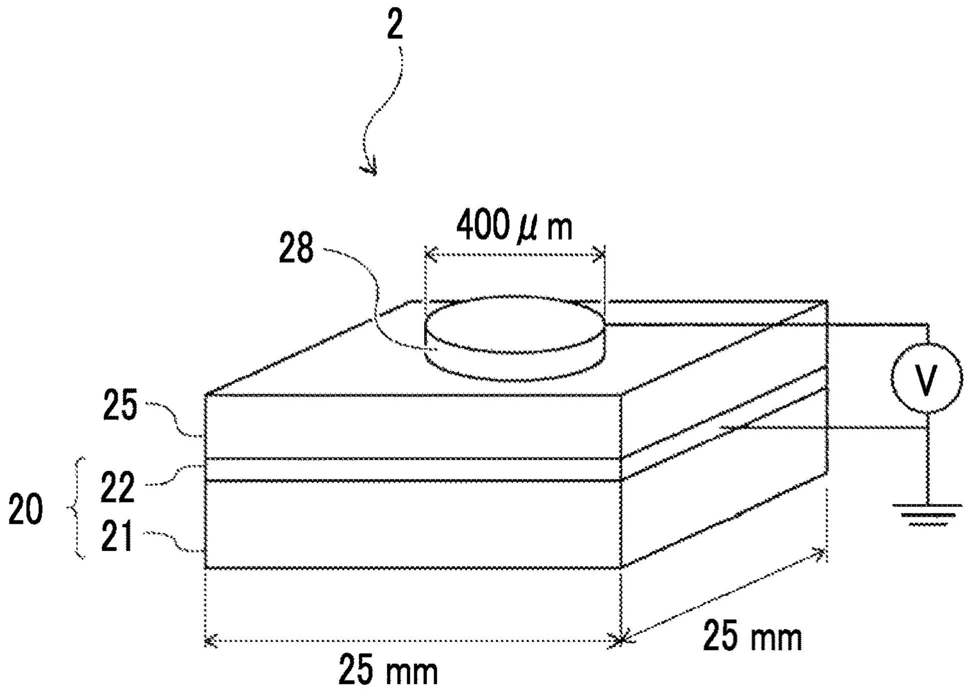
FIG. 3 is a view showing a schematic configuration of an evaluation sample.

Hereinafter, Examples and Comparative Examples according to the present disclosure will be described. FIG. 3 shows a schematic view of an evaluation sample 2 for a piezoelectric film of Example.

First, a manufacturing method for the evaluation sample 2 including a piezoelectric film of Example and Comparative Example will be described.

(Formation of Film of Lower Electrode Layer)

A Si wafer substrate was used as a substrate 21. A lower electrode layer 22 was formed into a film on the substrate 21. Specifically, as the lower electrode layer 22, a Ti layer having a thickness of 20 nm and an Ir layer having a thickness of 150 nm were laminated on the substrate 21 in this order.

(Formation of Piezoelectric Film)

Next, a piezoelectric film 25 was formed on the lower electrode layer 22 by a sputtering method. Specifically, as a sputter film formation apparatus, a radio-frequency (RF) sputtering apparatus described in JP2009-57599A was used. The sputtering apparatus includes apparatus a sputter electrode that holds a target material and generates plasma in a vacuum container, and a substrate holder that is disposed at a position facing the sputter electrode and holds a film-forming substrate. The substrate holder is connected to an impedance adjustment circuit. It is configured to be capable of changing a bias voltage of the film-forming substrate held by the substrate holder, by adjusting this impedance connection circuit. In such a sputter film formation apparatus, the piezoelectric film 25 was formed on the film-forming substrate 20 including the lower electrode layer 22 on the substrate 21. The sputtering conditions were as follows.

Target size: 8 inches

Distance between target and film-forming substrate: 100 mm

Temperature of film-forming substrate: 550° C.

Atmosphere: Mixture of Ar and $O_2$ ($O_2$ volume fraction: 2.5%)

Film formation pressure: 0.5 Pa

Input power to target: 3 kW

In the initial stage of the film formation of the piezoelectric film 25, a first bias voltage was applied to the film-forming substrate 20, and then the bias voltage was changed to a second bias voltage to carry out the film formation. The first bias voltage and the second bias voltage for each Example were as shown in Table 1 below. In each Example, the first bias voltage was set to a positive bias voltage (specifically, +40 V), and the second bias voltage was set to a negative bias voltage (specifically, −20 V to −100 V). It is noted that in Comparative Examples 1 to 3, the bias voltage applied to the film-forming substrate 20 was not changed.

The switching from the first bias voltage to the second bias voltage was carried out at a timing of moment when the film thickness of the piezoelectric film 25 reached 100 nm.

In Comparative Examples 1 and 2 and Examples 1 to 8, an Nb-doped PZT film of 2 μm was formed as the piezoelectric film 25. In addition, in Comparative Example 3 and Example 9, a PZT film of 2 μm was formed as the piezoelectric film 25. For Comparative Examples 1 and 2 and Examples 1 to 8, a $Pb_{1.3}Zr_{0.43}Ti_{0.44}Nb_{0.13}O_3$ target was used. For Comparative Example 3 and Example 9, a $Pb_{1.3}Zr_{0.52}Ti_{0.48}O_3$ target was used.

(Formation of Film of Upper Electrode Layer)

An upper electrode layer 28 was formed on the surface of the piezoelectric film 25 by sputtering. The upper electrode layer 28 was made of ITO and had a thickness of 100 nm.

In the manner described above, a laminate including the piezoelectric film of each of Examples or Comparative Examples was produced. Using this laminate, an evaluation sample was produced according to the procedure described below, and the piezoelectric film of each of Examples and Comparative Examples was evaluated.

<Evaluation of Crystallinity>

Figure 4:
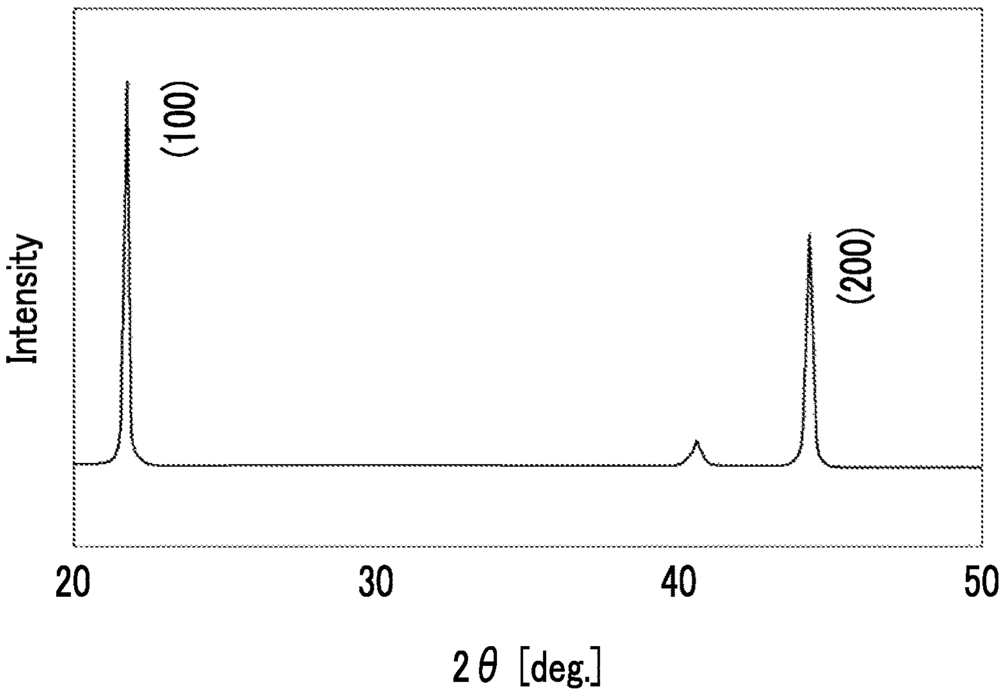
FIG. 4 is a view showing an XRD chart.

The XRD measurement was carried out, and the crystallinity of the piezoelectric film of Examples 1 to 8 and Comparative Examples 1 and 2, as Nb-PZT, was confirmed. As an example, FIG. 4 shows an XRD chart acquired for Example 2. In the XRD chart, the peak of the perovskite structure (100) plane is generated at 22°, and the peak of the perovskite structure (200) plane is generated at 44.5°. This piezoelectric film has the crystallinity of the (100) plane alignment. The XRD chart acquired for any of Examples and Comparative Examples other than Example 2 was substantially the same as the XRD chart shown in FIG. 4. That is, in any cases, the peaks of the perovskite structure were only those of the (100) plane and the (200) plane in a range of 2θ of 20° to 50°, and no significant difference was observed in the magnitude and half-width of each of the peaks.

<Composition Evaluation>

The composition of the piezoelectric film of each of Examples 1 to 8 and Comparative Examples 1 and 2, as Nb-PZT, was evaluated by the XRF measurement. As a result, in a case where the composition of the piezoelectric film was $Pb_a\{(Zr_xTi_{1-x})_{1-y}Nb_y\}O_z$, a was 1.12, x was 0.52, and y was 0.12 for any of Examples 1 to 8 and Comparative Examples 1 and 2. That is, no significant difference was observed in the compositions of the piezoelectric films of Examples 1 to 8 and Comparative Examples 1 and 2.

<Measurement of Piezoelectric Constant>

The piezoelectric constant of the piezoelectric element of each example was measured by the following method.

The laminate produced as described above was cut into a strip shape of 2 mm×25 mm to prepare a cantilever, and according to the method described in I. Kanno et. al., Sensor and Actuator A 107 (2003) 68, the piezoelectric constant $d_{31}$ was measured using an applied voltage of a sine wave of −10 V±10 V, that is, a bias voltage of −10 V, and an applied voltage of a sine wave having an amplitude of 10 V. The measurement results and evaluations are shown in Table 1.

The evaluation standards for the piezoelectric constant $d_{31}$ were as follows.

A: 200 pm/V or more

B: 150 pm/V or more and less than 200 pm/V

C: Less than 150 pm/V

<Measurement of Withstand Voltage>

The withstand voltage of the piezoelectric element was measured by the following method. The laminate produced as described above was cut into a square shape of 25 mm×25 mm, and the upper electrode layer 28 was patterned in a circular shape having a diameter of 400 m according to a lift-off method (see FIG. 3). The lower electrode layer 22 was grounded, the voltage as a negative potential to be applied to the upper electrode layer 28 was raised at a rate of change of 1 V/sec, and a voltage at which a current of 1 mA or more flowed was regarded as the dielectric breakdown voltage. A total of 10 measurements were carried out, and an average value (in terms of absolute value) therefrom was defined as a withstand voltage. The measurement results and evaluations are shown in Table 1.

The evaluation standards for withstand voltage are as follows.

A: 75V/μm or more

B: 50 μm or more and less than 75 V/μm

C: Less than 50 V/μm

<I-V Measurement>

For the I-V measurement, the same evaluation sample as that used for the withstand voltage measurement was used. The lower electrode layer 22 was grounded, the voltage was swept from −40 V to 40 V at a first change rate of 10 kV/μm·sec and applied to the upper electrode layer 28, and a current value was measured. Similarly, the lower electrode layer 22 was grounded, the voltage was swept from −40 V to 40 V at a second change rate of 50 kV/μm·sec and applied to the upper electrode layer 28, and a current value was measured. Strictly, the applied voltage was changed stepwise by 1 V for the circumstances of the measuring device, and the voltage rise time was controlled by controlling the holding time in each step to adjust the voltage change rate to a desired value.

The I-E profiles obtained by the above measurement are shown in FIG. 5 to FIG. 12. FIG. 5 to FIG. 12 shows the I-E profiles of Comparative Example 2, Examples 1 to 8, Comparative Example 3, and Example 9, respectively. The solid line indicates the profile measured at the first change rate (10 kV/μm·sec), and the broken line indicates the profile measured at the second change rate (50 kV/μm·sec). In all of Examples 1 to 5 and 9 respectively shown in FIG. 6 to 10 and FIG. 12, the first profile measured at the first change rate had two maximal values P1 and P2 (two peaks), and the second profile measured at the second change rate had one maximal value. The same applies to Examples 6 to 8 (not shown). On the other hand, in Comparative Examples 2 and 3 respectively shown in FIG. 5 and FIG. 11, both the first profile measured at the first change rate and the second profile measured at the second change rate had only one maximal value. It is noted that in Comparative Example 1 as well, similar to Comparative Example 2, both profiles respectively measured at the first change rate and the second change rate had only one maximal value. It is noted that here, the maximal value refers to a point at which a maximal value (see FIG. 2) is exhibited in a state where the influence of the S/N of the measurement is removed from the profile. Regarding the two maximal values, a ratio P2/P1 of the maximal value P1 on the low voltage side to the maximal value P2 on the high voltage side was determined as the peak intensity ratio. The peak intensity ratio P2/P1 for each Example is shown in Table 1.

<Reliability Test>

For the reliability test, the same evaluation sample as the sample used for the withstand voltage measurement was used. In an environment of 120° C., the lower electrode layer 22 was grounded, a voltage of −40 V was applied to the upper electrode layer 28, and the time (hr) taken from the start of the voltage application to the occurrence of dielectric breakdown was measured. The measurement results and evaluations are shown in Table 1. It is noted that the reliability test was carried out for 1,000 hours, and a case where the dielectric breakdown did not occur for 1,000 hours and the time taken until the dielectric breakdown occurred exceeded 1,000 hours were described as "1,000<" in Table 1.

The evaluation standards for the reliability test were as follows.

A: 500 hr or more

B: 200 hr or more and less than 500 hr

C: Less than 200 hr

TABLE 1

| | Film material | First bias voltage (V) | Second bias voltage (V) | Peak intensity ratio P2/P1 | piezoelectric constant d31 | | Voltage endurance | | Reliability | | Comprehensive evaluation |
|---|---|---|---|---|---|---|---|---|---|---|---|
| | | | | | | Evaluation | (V) | Evaluation | (hr) | Evaluation | |
| Comparative Example 1 | Nb-PZT | −40 | −40 | — | 120 | C | 30 | C | 100 | C | C |
| Comparative Example 2 | Nb-PZT | 40 | 40 | — | 220 | A | 60 | A | 100 | C | C |
| Example 1 | Nb-PZT | 40 | −20 | 0.2 | 220 | A | 65 | A | 250 | B | B |
| Example 2 | Nb-PZT | 40 | −40 | 0.3 | 210 | A | 75 | A | 1000< | A | A |
| Example 3 | Nb-PZT | 40 | −60 | 0.7 | 205 | A | 80 | A | 1000< | A | A |

TABLE 1-continued

| | Film material | First bias voltage (V) | Second bias voltage (V) | Peak intensity ratio P2/P1 | piezoelectric constant d31 | Evaluation | Voltage endurance (V) | Evaluation | Reliability (hr) | Evaluation | Comprehensive evaluation |
|---|---|---|---|---|---|---|---|---|---|---|---|
| Example 4 | Nb-PZT | 40 | −80 | 1 | 200 | A | 80 | A | 1000< | A | A |
| Example 5 | Nb-PZT | 40 | −100 | 1.2 | 150 | B | 85 | A | 1000< | A | B |
| Example 6 | Nb-PZT | 0 (ground) | −60 | 0.6 | 190 | B | 75 | A | 1000< | A | B |
| Example 7 | Nb-PZT | 20 | −60 | 0.7 | 200 | A | 80 | A | 1000< | A | A |
| Example 8 | Nb-PZT | 60 | −60 | 0.8 | 175 | B | 70 | A | 750 | A | B |
| Comparative Example 3 | PZT | 40 | 40 | — | 200 | A | 50 | B | 50 | C | C |
| Example 9 | PZT | 40 | −40 | 0.3 | 185 | B | 55 | B | 300 | B | B |

Table 1 shows the results of the comprehensive evaluation from the viewpoints of piezoelectric constant, withstand voltage, and reliability, as comprehensive evaluation. In consideration of practicality, the lowest evaluation result, among the evaluations of the piezoelectric constant, the withstand voltage, and the reliability, was taken for the comprehensive evaluation.

Among Comparative Examples 1 to 3 in which the bias voltage was not changed during the film formation, in Comparative Examples 2 and 3 in which the positive bias voltage was applied, although the evaluations of the piezoelectric constant and the withstand voltage were respectively A and B, which causes no problem in practical use, the evaluation of the reliability test was C, and thus sufficient long-term reliability could not be obtained. On the other hand, in all of Examples 1 to 9 according to the present disclosure, the evaluations were B or higher in the reliability test, and thus long-term reliability was obtained. In addition, in Examples 1 to 9, the evaluations were B or higher, which can withstand practical use, and thus it can be said that the piezoelectric film has both withstand voltage and reliability. From Table 1, it is revealed that the piezoelectric film having two peaks in the I-E profile acquired by carrying out the measurement at the first change rate has high long-term reliability as compared with the piezoelectric film having only one peak in the I-E profile acquired by carrying out the measurement at the first change rate has high long-term reliability. In particular, in Examples 2 to 5 in which the piezoelectric film is an Nb-PZT piezoelectric film and the peak intensity ratio P2/P1 is 0.3 or more and 1.2 or less, more than 1,000 hours were achieved, and thus particularly high reliability was obtained.

In all of the piezoelectric films of Examples 1 to 9, a positive bias voltage was applied to the film-forming substrate 10 in the initial stage of film formation, and then switching was carried out to a negative bias voltage to carry out film formation. In the piezoelectric films of Comparative Examples 1 and 2 and Examples 1 to 8, which are piezoelectric films formed under the same film forming conditions except for the bias voltage, no difference was observed in XRD and XRF between the piezoelectric films of Comparative Examples 1 and 2 and the piezoelectric films of Examples 1 to 8. That is, it was indistinguishable in terms of the crystal structure and the compositional ratio observed by XRD and XRF. However, as described above, the I-E profile acquired by measuring the piezoelectric film of Example and the piezoelectric film of Comparative Example at the first change rate had a clear difference that the maximal value (peak) was two or one. In addition, as shown in Table 1, it is revealed that the piezoelectric film having two maximal values in the I-E profile acquired by carrying out the measurement at the first change rate can achieve both high withstand voltage and high reliability. It is noted that in particular, a piezoelectric film having higher reliability was obtained by adjusting the second bias voltage between −40 V and −100 V as in Examples 2 to 5. In addition, as in Examples 3 and 6 to 8, a piezoelectric film having good piezoelectric characteristics, voltage endurance, and reliability was obtained in a range of a first bias voltage of 0 to 60 V.

The disclosure of JP2021-051660 filed on Mar. 25, 2021 is incorporated in the present specification by reference in its entirety.

All documents, patent applications, and technical standards described in the present specification are incorporated herein by reference, to the same extent as in the case where each of the documents, patent applications, and technical standards is specifically and individually described.

What is claimed is:

1. A piezoelectric film comprising:

a perovskite-type oxide as a main component, wherein a current-voltage profile showing a relationship between a voltage and a current that flows in a case where the voltage is applied has two maximal values, where the current-voltage profile is acquired in a case where the voltage is sweep-applied from −40 V to +40 V at a first change rate of 10 kV/cm·sec while the piezoelectric film is sandwiched between a pair of electrode layers.

2. The piezoelectric film according to claim 1, wherein a current-voltage profile showing a relationship between a voltage and a current that flows in a case where the voltage is applied has only one maximal value, where the current-voltage profile is acquired in a case where the voltage is sweep-applied from −40 V to +40 V at a second change rate of 50 kV/cm-sec while the piezoelectric film is sandwiched between the pair of electrode layers.

3. The piezoelectric film according to claim 1, wherein in a case where, among the two maximal values in the current-voltage profile acquired at the first change rate, a maximal value on a low voltage side is denoted as P1, and a maximal value on a high voltage side is denoted as P2, 0.3≤P2/P1 is satisfied.

4. The piezoelectric film according to claim 1, wherein in a case where, among the two maximal values in the current-voltage profile acquired at the first change rate, a maximal value on a low voltage side is denoted as P1, and a maximal value on a high voltage side is denoted as P2, P2/P1≤1 is satisfied.

5. The piezoelectric film according to claim 1, wherein the perovskite-type oxide contains Pb, Zr, Ti, and O.

6. The piezoelectric film according to claim 5, wherein the perovskite-type oxide is a compound represented by General Formula (1), $$Pb\{(Zr_xTi_{1-x})_{1-y}M_y\}O_3 \quad (1)$$

$0<x<1$, $0<y<0.3$, here, M is one or more elements selected from V, Nb, Ta, Sb, Mo, and W.

7. The piezoelectric film according to claim 1, wherein the piezoelectric film is an alignment film having a (100) plane alignment.

8. The piezoelectric film according to claim 1, wherein a magnitude of a piezoelectric constant $d_{31}$ is 200 pm/V or more, and a withstand voltage is 50 V/km or more.

9. A piezoelectric element that is obtained by laminating, on one surface of a substrate, a lower electrode, a piezoelectric film, and an upper electrode in this order, wherein the piezoelectric film is the piezoelectric film according to claim 1.

10. A manufacturing method for a piezoelectric film, which is a manufacturing method for the piezoelectric film according to claim 1, the manufacturing method comprising:

in a case of forming a film of the piezoelectric film on a film-forming substrate by a sputtering method, carrying out the film formation in an initial stage of the film formation in a state where the film-forming substrate is grounded or in a state where a positive bias voltage is applied to the film-forming substrate, and then carrying out the film formation in a state where a negative bias voltage is applied to the film-forming substrate.

11. The manufacturing method for a piezoelectric film according to claim 10, wherein the negative bias voltage is from −20 V to −100 V.

* * * * *